US012559832B2

(12) United States Patent
Li et al.

(10) Patent No.: US 12,559,832 B2
(45) Date of Patent: Feb. 24, 2026

(54) NANOCOMPOSITE DIELECTRIC FILM MATERIAL FOR ENERGY STORAGE PREPARED BY VERTICAL SELF-ASSEMBLY OF LEAD ZIRCONATE TITANATE AND MAGNESIUM OXIDE, AND PREPARATION METHOD THEREOF

(71) Applicant: Nanjing University of Aeronautics and Astronautics, Nanjing (CN)

(72) Inventors: Weiwei Li, Nanjing (CN); Yajing Liu, Nanjing (CN)

(73) Assignee: Nanjing University of Aeronautics and Astronautics, Nanjing (CN)

( * ) Notice: Subject to any disclaimer, the term of this patent is extended or adjusted under 35 U.S.C. 154(b) by 56 days.

(21) Appl. No.: 18/520,764

(22) Filed: Nov. 28, 2023

(65) Prior Publication Data

US 2024/0191339 A1 Jun. 13, 2024

(30) Foreign Application Priority Data

Dec. 7, 2022 (CN) .......................... 202211560899.3

(51) Int. Cl.
*C23C 14/08* (2006.01)
*C23C 14/28* (2006.01)
*C23C 14/58* (2006.01)

(52) U.S. Cl.
CPC ............ *C23C 14/088* (2013.01); *C23C 14/28* (2013.01); *C23C 14/5806* (2013.01)

(58) Field of Classification Search
CPC ... C23C 14/088; C23C 14/28; C23C 14/5806; Y02E 60/13
See application file for complete search history.

(56) References Cited

FOREIGN PATENT DOCUMENTS

CN 112645709 A * 4/2021 ........... C04B 35/491

* cited by examiner

*Primary Examiner* — Hua Qi
(74) *Attorney, Agent, or Firm* — Bay State IP, LLC

(57) ABSTRACT

Provided are a nanocomposite dielectric film material for energy storage prepared by vertical self-assembly of lead zirconate titanate (PZT) and magnesium oxide (MgO), and a preparation method thereof. The method includes: 1, preparing a PZT powder; 2, mixing the PZT powder with an MgO powder to obtain a uniformly mixed PM composite powder; and mixing the PM composite powder with a binder, and subjecting a resulting mixture to tableting and cold isostatic pressing to obtain a PM composite target blank; 3, sintering the PM composite target blank at a temperature of not higher than 900° C. to obtain a PM composite target; and 4, subjecting the PM composite target to pulsed laser deposition to form an epitaxial vertical self-assembly composite dielectric film; and subjecting the epitaxial vertical self-assembly composite dielectric film to annealing to obtain the film material.

9 Claims, 11 Drawing Sheets

Subjecting raw materials of PZT to mixing, ball milling, drying, and sieving in sequence to obtain a mixture; and presintering the mixture to obtain a PZT powder Mixing the PZT powder with an MgO powder to obtain a mixed PM composite powder, and subjecting the mixed PM composite powder to ball milling, drying, and tableting in sequence to obtain a PM composite target blank Sintering the PM composite target blank at a lower temperature to obtain a PM composite target Subjecting the PM composite target to pulsed laser deposition and in-situ annealing in sequence to obtain a dielectric film material Subjecting raw materials of PZT to mixing, ball milling, drying, and sieving insequence to obtain a mixture; and presintering the mixture to obtain a PZT powder

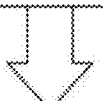

Mixing the PZT powder with an MgO powder to obtain a mixed PM composite powder, and subjecting the mixed PM composite powder to ball milling, drying, and tableting in sequence to obtain a PM composite target blank

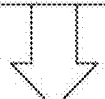

Sintering the PM composite target blank at a lower temperature to obtain a PM composite target Subjecting the PM composite target to pulsed laser deposition and in-situ annealing in sequence to obtain a dielectric film material

FIG. 1

PZT $P_{80}M_{20}$ $P_{50}M_{50}$

NANOCOMPOSITE DIELECTRIC FILM MATERIAL FOR ENERGY STORAGE PREPARED BY VERTICAL SELF-ASSEMBLY OF LEAD ZIRCONATE TITANATE AND MAGNESIUM OXIDE, AND PREPARATION METHOD THEREOF

CROSS REFERENCE TO RELATED APPLICATION

This patent application claims the benefit and priority of Chinese Patent Application No. 202211560899.3 filed with the China National Intellectual Property Administration on Dec. 7, 2022, the disclosure of which is incorporated by reference herein in its entirety as part of the present application.

TECHNICAL FIELD

The present disclosure belongs to the field of dielectric materials, relates to a dielectric material, and in particular to a nanocomposite dielectric film material for energy storage prepared by vertical self-assembly of lead zirconate titanate (PZT) and magnesium oxide (MgO), and a preparation method thereof.

BACKGROUND

Due to rapid depletion and huge consumption of fossil fuels and the resulting environmental problems, there is an increasing demand for clean and renewable energy materials. Dielectric capacitors could store and release charges in extremely short periods of time and have a high power density; thus, their applications in pulsed power electronic systems have been extensively studied. However, currently commercialized dielectric materials have a poor energy storage density (only about 1 J/cm$^3$). Compared with other energy storage systems (such as batteries or supercapacitors), the energy storage density of the currently commercialized dielectric materials is one to two orders of magnitude lower than that of the other energy storage systems. As a result, these dielectric materials could not meet the needs of advanced power electronic systems for integration and miniaturization. Therefore, it is an urgent need to develop miniaturized dielectric capacitors with high energy density and low cost in the field of dielectric energy storage.

Lead-based ferroelectric materials, such as lead zirconate titanate (PbZr$_{1-x}$Ti$_x$O$_3$), lead magnesium niobate-lead titanate (Pb(Mg,Nb)O$_3$—PbTiO$_3$), lead zirconate (PbZrO$_3$), and lead titanate (PbTiO$_3$) have always occupied a dominant position in the market and research fields due to their excellent electrical properties, high mechanical properties, desirable thermal stability, and adjustable composition. Currently, Martin's research group discloses a 0.68Pb(Mg$_{1/3}$Nb$_{2/3}$)O$_{3-0.32}$PbTiO$_3$ with a high energy density (133 J/cm$^3$) and an energy storage efficiency of not less than 75% by ion bombardment (see *Science*, Vol. 369, Issue 6499, pages 81-84, 2020). Nguyen et al. have achieved a high energy density of 128.4 J/cm$^3$ and a high energy storage efficiency of 81.2% by regulating a number of layers in a PbZrO$_3$/Pb$_{0.9}$La$_{0.1}$Zr$_{0.52}$Ti$_{0.48}$O$_3$ multilayer structure (see *Advanced Energy Material*, Vol. 12, Issue 29, 2200517, pages 1-14, 2022). However, the energy density achieved at present is still far from that of lithium batteries or fuel cells. Accordingly, it is a key issue to develop dielectric capacitor films with higher energy density in the field of related energy technologies.

Compared with traditional interface heterostructures, such as superlattice and multilayer structures, a heteroepitaxial nanocomposite grown by a vertical self-assembly manner has a larger interface area and could produce more interface effects at its interface, such as strain, ion implantation, and effective defects. These effects enable the manipulation of various functional properties of the materials, such as ferroelectric properties, magnetism, and electrical conductivity (see *Advanced Materials*, Vol. 31, Issue 4, 1803241, pages 1-30, 2019). However, there is currently no report on regulating the energy storage performance using vertical self-assembly-prepared structures.

SUMMARY

An object of the present disclosure is to provide a nanocomposite dielectric film material for energy storage prepared by vertical self-assembly of lead zirconate titanate (PZT) and magnesium oxide (MgO), and a preparation method thereof, to overcome the defects of the prior art.

In order to achieve the above object, the present disclosure provides a method for preparing a nanocomposite dielectric film material for energy storage prepared by vertical self-assembly of PZT and MgO, including:

step 1, preparing a PZT (PbZr$_{1-x}$Ti$_x$O$_3$) powder;

step 2, mixing the PZT powder obtained in step 1 with an MgO powder to obtain a uniformly mixed PM (PZT:MgO) composite powder; mixing the PM composite powder with a binder to obtain a mixture; and subjecting the mixture to tableting and cold isostatic pressing to obtain a PM composite target blank;

step 3, sintering the PM composite target blank obtained in step 2 at a temperature of not higher than 900° C. to obtain a PM composite target; and step 4, subjecting the PM composite target obtained in step 3 to pulsed laser deposition to form an epitaxial vertical self-assembly composite dielectric film, wherein during the pulsed laser deposition, an ordered structure is spontaneously formed by a PZT phase and an MgO phase, and then deposited to form an epitaxial vertical self-assembly composite dielectric film; and subjecting the epitaxial vertical self-assembly composite dielectric film to annealing to obtain the nanocomposite dielectric film material for energy storage.

In some embodiments, in step 1, the PZT powder is prepared from PbO, ZrO$_2$, and TiO$_2$; and a mass ratio of the PbO, the ZrO$_2$, and the TiO$_2$ is in a range of (6.66-6.88):(1.77-1.83):(1.02-1.05).

In some embodiments, a mass ratio of the MgO powder to the PZT powder is in a range of (0.28-0.59):(9.41-9.72).

In some embodiments, in step 1, preparing the PZT powder is performed by: mixing raw material powders of the PbO, the ZrO$_2$, and the TiO$_2$ to obtain a mixed powder; mixing the mixed powder with absolute ethanol to obtain a mixed material; subjecting the mixed material to ball milling for 12 h to obtain a ball milled material; subjecting the ball milled material to drying and sieving sequentially to obtain a uniformly mixed raw material powder; and presintering the uniformly mixed raw material powder by heating the uniformly mixed raw material powder from ambient temperature to a temperature of 950° C. to 1,000° C. at a heating rate of 5° C./min, maintaining at the temperature for 6 h, and then cooling to ambient temperature at a cooling rate of 5° C./min to obtain the PZT powder.

In some embodiments, the method further includes in step 2, after mixing the PZT powder with the MgO powder, subjecting an obtained powder mixture to ball milling, drying, and sieving in sequence to obtain the uniformly mixed PM composite powder. In some embodiments, the binder is polyvinyl alcohol (PVA) with a mass fraction of 5%. In some embodiments, the tableting is conducted at a pressure of 9 MPa to 11 MPa; and the cold isostatic pressing is conducted for 30 min.

In some embodiments, in step 3, the sintering is performed by: heating the PM composite target blank from ambient temperature to 500° C. at a heating rate of 5° C./min, and maintaining at 500° C. for 1 h to remove the binder to obtain a binder-removed material; heating the binder-removed material to a temperature of 800° C. to 850° C. at a heating rate of 5° C./min, and maintaining at the temperature for 2 h to perform sintering to obtain a sintered material; and cooling the sintered material to ambient temperature at a cooling rate of 5° C./min to obtain the PM composite target.

In some embodiments, in step 4, the pulsed laser deposition is performed by: bombarding the PM composite target with a KrF laser ($\lambda$=248 nm), such that components in the PM composite target are ablated and vaporized in a stoichiometric ratio to form a high-temperature and high-pressure plasma plume in a vacuum chamber, and the high-temperature and high-pressure plasma plume is diffused to a (001) strontium titanate ($SrTiO_3$) (STO) substrate with a strontium ruthenate ($SrRuO_3$) (SRO) bottom electrode layer and deposited and grown into the epitaxial vertical self-assembly composite dielectric film. During the diffusing of the high-temperature and high-pressure plasma plume to the substrate, an ordered structure is spontaneously formed by the PZT phase and the MgO phase, and deposited to form the epitaxial vertical self-assembly composite dielectric film. In some embodiments, bombarding the PM composite target with the KrF laser is performed at an energy density of the KrF laser of 1.2 J·cm$^{-2}$ to 1.8 J·cm$^{-2}$, a repetition frequency of the KrF laser of 4 Hz, a temperature of the substrate of 495° C. to 510° C., and an oxygen partial pressure of 0.15 mbar. In some embodiments, in the STO substrate with an SRO bottom electrode layer, the SRO bottom electrode layer is obtained by depositing SRO at a temperature of 630° C. and an oxygen partial pressure of 0.15 mbar. In some embodiments, the SRO bottom electrode layer has a thickness of 30 nm. During the pulsed laser deposition to prepare PM film, it should be noted that: the energy density of the KrF laser preferably does not exceed 1.8 J·cm$^{-2}$, because an excessively high energy density may cause a crystal quality of the PZT phase to deteriorate; the substrate preferably has a temperature of 495° C. to 510° C., because an excessively low temperature is not conducive to the growth of the MgO phase, and an excessively high temperature may cause serious volatilization of Pb, resulting in poor quality growth of the PZT phase.

In some embodiments, in step 4, the annealing is performed by subjecting the epitaxial vertical self-assembly composite dielectric film to in-situ annealing at an oxygen partial pressure of 5 mbar and a temperature of 510° C. for 20 min, and then naturally cooling to ambient temperature.

In some embodiments, the nanocomposite dielectric film material for energy storage has a thickness of 100 nm.

Another object of the present disclosure is to provide a nanocomposite dielectric film material for energy storage prepared by vertical self-assembly of PZT and MgO prepared by the above described method.

The present disclosure has the following beneficial effects:

In the present disclosure, a ferroelectric material $PbZr_{0.53}Ti_{0.47}O_3$(PZT) located near the quasi-isotropic phase boundary component and a linear dielectric magnesium oxide (MgO) are selected to form a composite film material by vertical self-assembly. By adjusting a ratio of the PZT to MgO, a transition from ferroelectric to relaxor antiferroelectric properties is achieved, thereby greatly improving an energy storage performance.

In the present disclosure, by adjusting the ratio of the PZT to MgO, the nanocomposite dielectric film material for energy storage prepared by vertical self-assembly of PZT and MgO has a breakdown field strength of up to 6.2 MV/cm, an energy storage density of up to 169.4 J/cm$^3$, and a high energy storage efficiency of 78%. In addition, a $P_{50}M_{50}$ composite film material could maintain a stable energy storage performance after $10^{10}$ times of polarization fatigue and under a high temperature of up to 170° C. Experiments have proven that the nanocomposite dielectric film material for energy storage prepared by vertical self-assembly of PZT and MgO has a relatively high dielectric constant, a relatively low dielectric loss, a relatively high breakdown field strength, and an excellent energy storage performance. Therefore, the nanocomposite dielectric film material is a promising material for applications in dielectric energy storage fields such as embedded capacitors, electrostatic energy storage components, and pulsed power technology.

BRIEF DESCRIPTION OF THE DRAWINGS

FIG. 1 shows a flow chart for preparing the nanocomposite dielectric film material for energy storage prepared by vertical self-assembly of PZT and MgO according to an embodiment of the present disclosure;

DETAILED DESCRIPTION OF THE EMBODIMENTS

Figure 2A:
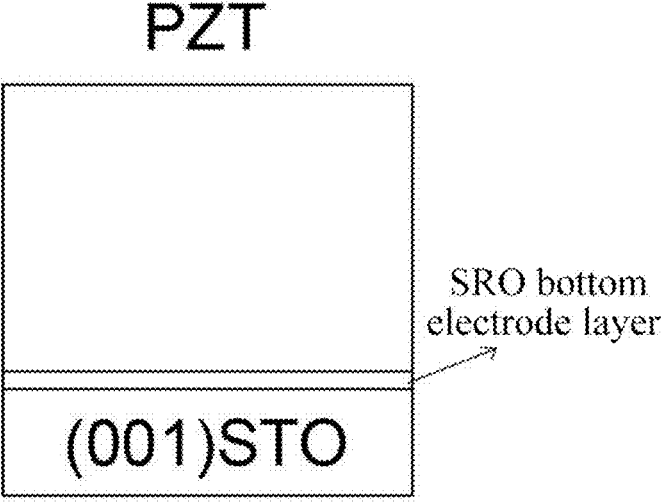
FIG. 2A shows a model diagram of the film materials prepared in Comparative Example.

The present disclosure will be further described below in conjunction with specific examples.

Example 1

This example provided a nanocomposite dielectric film material for energy storage prepared by vertical self-assembly of PZT and MgO. A preparation method thereof was shown in FIG. 1 and performed as follows:

Step 1, preparation of a PZT powder: raw material powders of 6.88 g of PbO, 1.83 g of $ZrO_2$, and 1.05 g of $TiO_2$ were mixed to obtain a mixed powder, and the mixed powder was mixed with absolute ethanol, and then subjected to ball milling for 12 h to obtain a ball milled material. The balled milled material was subjected to drying and sieving sequentially to obtain a uniformly mixed raw material powder. The uniformly mixed raw material powder was presintered by the following procedures: the uniformly mixed raw material powder was heated from ambient temperature to 950° C. at a heating rate of 5° C./min, maintained at 950° C. for 6 h, and then cooled to ambient temperature at a cooling rate of 5° C./min to obtain the PZT powder.

Step 2, the PZT powder obtained in step 1 and 0.28 g of an MgO powder were mixed, and subjected to ball milling, drying, and sieving to obtain a uniformly mixed $P_{80}M_{20}$ (0.8PZT-0.2MgO) composite powder.

The $P_{80}M_{20}$ composite powder was mixed with a PVA binder having a mass fraction of 5% to obtain a mixture. The mixture was subjected to tableting at a pressure of 9 MPa and cold isostatic pressing for 30 min to obtain a $P_{80}M_{20}$ composite target blank.

Step 3, the $P_{80}M_{20}$ composite target blank obtained in step 2 was sintered by the following procedures: the $P_{80}M_{20}$ composite target blank was heated from ambient temperature to 500° C. at a heating rate of 5° C./min, and maintained at 500° C. for 1 h to remove the binder to obtain a binder-removed material; the binder-removed material was heated to 800° C. at a heating rate of 5° C./min and maintained at 800° C. for 2 h to perform sintering to obtain a sintered material; and the sintered material was cooled to ambient temperature at a cooling rate of 5° C./min to obtain a $P_{80}M_{20}$ composite target.

Step 4, the $P_{80}M_{20}$ composite target obtained in step 3 was subjected to pulsed laser deposition by the following procedures: the $P_{80}M_{20}$ composite target was bombarded with a KrF laser ($\lambda$=248 nm), such that components in the $P_{80}M_{20}$ composite target were ablated and vaporized in a stoichiometric ratio to form a high-temperature and high-pressure plasma plume in a vacuum chamber, and the high-temperature and high-pressure plasma plume was diffused to a (001) STO substrate with an SRO bottom electrode layer and deposited and grown into an epitaxial vertical self-assembly composite dielectric film. During the diffusing of the high-temperature and high-pressure plasma plume to the substrate, an ordered structure was spontaneously formed by the PZT phase and the MgO phase, and deposited to form the epitaxial vertical self-assembly composite dielectric film.

The pulsed laser deposition was performed at an energy density of the KrF laser of 1.8 J·cm$^{-2}$, a repetition frequency of the KrF laser of 4 Hz, a temperature of the substrate of 510° C. and an oxygen partial pressure of 0.15 mbar. In the STO substrate with an SRO bottom electrode layer, the SRO bottom electrode layer was obtained by depositing SRO at 630° C. and an oxygen partial pressure of 0.15 mbar. The SRO bottom electrode layer had a thickness of 30 nm.

The film obtained by pulsed laser deposition was subjected to in-situ annealing at an oxygen partial pressure of 5 mbar and 510° C. for 20 min, and then naturally cooled to ambient temperature to obtain a film material for energy storage ($P_{80}M_{20}$ composite film material).

The film material for energy storage has a thickness of 100 nm.

Example 2

This example provided a nanocomposite dielectric film material for energy storage prepared by vertical self-assembly of PZT and MgO. A preparation method thereof was shown in FIG. 1 and performed as follows:

Step 1, preparation of a PZT powder: raw material powders of 6.66 g of PbO, 1.77 g of $ZrO_2$, and 1.02 g of $TiO_2$ were mixed to obtain a mixed powder, and the mixed powder was mixed with absolute ethanol, and then subjected to ball milling for 12 h to obtain a ball milled material. The ball milled material was subjected to drying and sieving sequentially to obtain a uniformly mixed raw material powder. The uniformly mixed raw material powder was presintered by the following procedures: the uniformly mixed raw material powder was heated from ambient temperature to 1,000° C. at a heating rate of 5° C./min, maintained at 1,000° C. for 6 h, and then cooled to ambient temperature at a cooling rate of 5° C./min to obtain the PZT powder.

Step 2, the PZT powder obtained in step 1 and 0.59 g of an MgO powder were mixed, and subjected to ball milling, drying, and sieving to obtain a uniformly mixed $P_{50}M_{50}$ (0.5PZT-0.5MgO) composite powder.

The $P_{50}M_{50}$ composite powder was mixed with a PVA binder having a mass fraction of 5% to obtain a mixture. The mixture was subjected to tableting at a pressure of 11 MPa and cold isostatic pressing for 30 min to obtain a $P_{50}M_{50}$ composite target blank.

Step 3, the $P_{50}M_{50}$ composite target blank obtained in step 2 was sintered by the following procedures: the $P_{50}M_{50}$ composite target blank was heated from ambient temperature to 500° C. at a heating rate of 5° C./min, and maintained at 500° C. for 1 h to remove the binder to obtain a binder-removed material; the binder-removed material was heated to 850° C. at a heating rate of 5° C./min and maintained at 850° C. for 2 h to perform sintering to obtain a sintered material; and the sintered material was cooled to ambient temperature at a cooling rate of 5° C./min to obtain a $P_{50}M_{50}$ composite target.

Step 4, the $P_{50}M_{50}$ composite target obtained in step 3 was subjected to pulsed laser deposition by the following procedures: the $P_{50}M_{50}$ composite target was bombarded with a KrF laser ($\lambda$=248 nm), such that components in the $P_{50}M_{50}$ composite target were ablated and vaporized in a stoichiometric ratio to form a high-temperature and high-pressure plasma plume in a vacuum chamber, and the plasma plume was diffused to a (001) STO substrate with an SRO bottom electrode layer and deposited and grown into an epitaxial vertical self-assembly composite dielectric film. During the diffusing of the high-temperature and high-pressure plasma plume to the substrate, an ordered structure was spontaneously formed by the PZT phase and the MgO phase, and deposited to form the epitaxial vertical self-assembly composite dielectric film.

The pulsed laser deposition was performed at an energy density of the KrF laser of 1.2 J·cm$^{-2}$, a repetition frequency of the KrF laser of 4 Hz, a temperature of the substrate of 495° C. and an oxygen partial pressure of 0.15 mbar. In the STO substrate with an SRO bottom electrode layer, the SRO bottom electrode layer was obtained by depositing SRO at 630° C. and an oxygen partial pressure of 0.15 mbar. The SRO bottom electrode layer had a thickness of 30 nm.

The film obtained by pulsed laser deposition was subjected to in-situ annealing at an oxygen partial pressure of 5 mbar and 510° C. for 20 min, and then naturally cooled to ambient temperature to obtain a film material for energy storage ($P_{50}M_{50}$ composite film material).

The film material for energy storage has a thickness of 100 nm.

Comparative Example

This comparative example provided a PZT dielectric film, and a preparation method thereof was performed as follows:

Step 1, preparation of a PZT powder: raw material powders of 6.66 g of PbO, 1.77 g of ZrO$_2$, and 1.02 g of TiO$_2$ were mixed to obtain a mixed powder, the mixed powder was mixed with absolute ethanol, and then subjected to ball milling for 12 h to obtain a ball milled material. The ball milled material was subjected to drying and sieving sequentially to obtain a uniformly mixed raw material powder. The uniformly mixed raw material powder was presintered by the following procedures: the uniformly mixed raw material powder was heated from ambient temperature to 1,000° C. at a heating rate of 5° C./min, maintained at 1,000° C. for 6 h, and then cooled to ambient temperature at a cooling rate of 5° C./min to obtain the PZT powder.

Step 2, the PZT powder obtained in step 1 was mixed with a PVA binder having a mass fraction of 5% to obtain a mixture. The mixture was subjected to tableting at a pressure of 11 MPa and cold isostatic pressing for 30 min to obtain a pure PZT target blank.

Step 3, the pure PZT target blank obtained in step 2 was sintered by the following procedures: the pure PZT target blank was heated from ambient temperature to 500° C. at a heating rate of 5° C./min, and maintained 500° C. for 1 h to remove the binder to obtain a binder-removed material; the binder-removed material was heated to 850° C. at a heating rate of 5° C./min and maintained at 850° C. for 2 h to perform sintering to obtain a sintered material; and the sintered material was cooled to ambient temperature at a cooling rate of 5° C./min to obtain a pure PZT target.

Step 4, the pure PZT target obtained in step 3 was subjected to pulsed laser deposition by the following procedures: the pure PZT target was bombarded with a KrF laser (λ=248 nm), such that components in the pure PZT target were ablated and vaporized to form a high-temperature and high-pressure plasma plume in a vacuum chamber, and the high-temperature and high-pressure plasma plume was diffused to a (001) STO substrate with an SRO bottom electrode layer, and deposited and grown into a dielectric film.

The pulsed laser deposition was performed at an energy density of the KrF laser of 1.8 J·cm$^{-2}$, a repetition frequency of the KrF laser of 4 Hz, a temperature of the substrate of 510° C. and an oxygen partial pressure of 0.15 mbar. In the STO substrate with an SRO bottom electrode layer, the SRO bottom electrode layer was obtained by depositing SRO at 630° C. and an oxygen partial pressure of 0.15 mbar. The SRO bottom electrode layer had a thickness of 30 nm.

The film obtained by pulsed laser deposition was subjected to in-situ annealing at an oxygen partial pressure of 5 mbar and 510° C. for 20 min, and then naturally cooled to ambient temperature to obtain a film material (pure PZT film material).

The film material has a thickness of 100 nm.

Figure 2B:
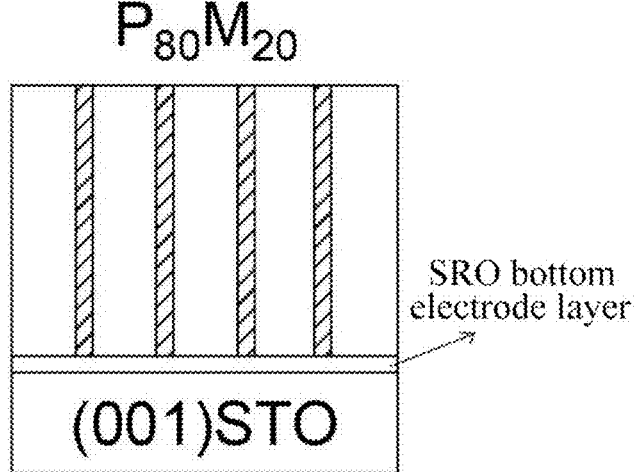
FIG. 2B shows a model diagram of the film materials prepared in Example 1.
Figure 2C:
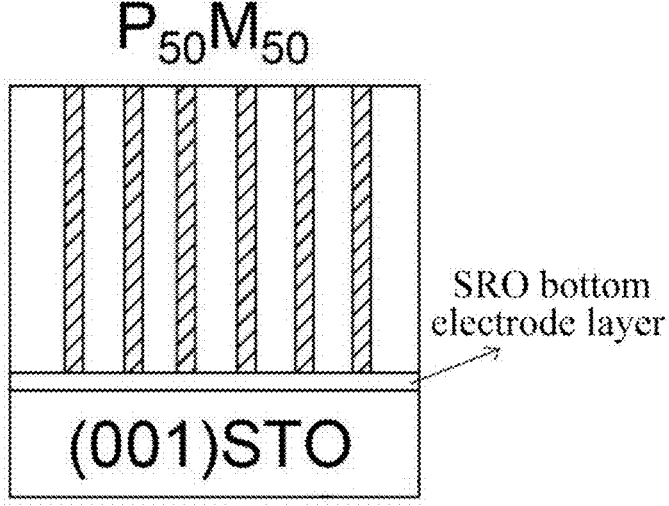
FIG. 2C shows a model diagram of the film materials prepared in Example 2.
Figure 2D:
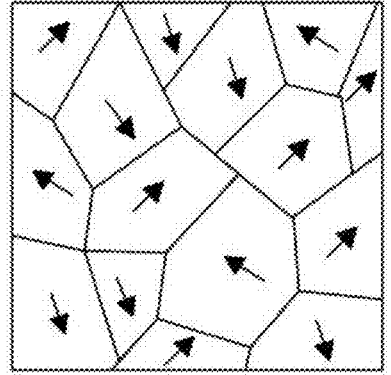
FIG. 2D shows a schematic diagram of a ferroelectric domain structure of the film materials prepared in Comparative Example.
Figure 2E:
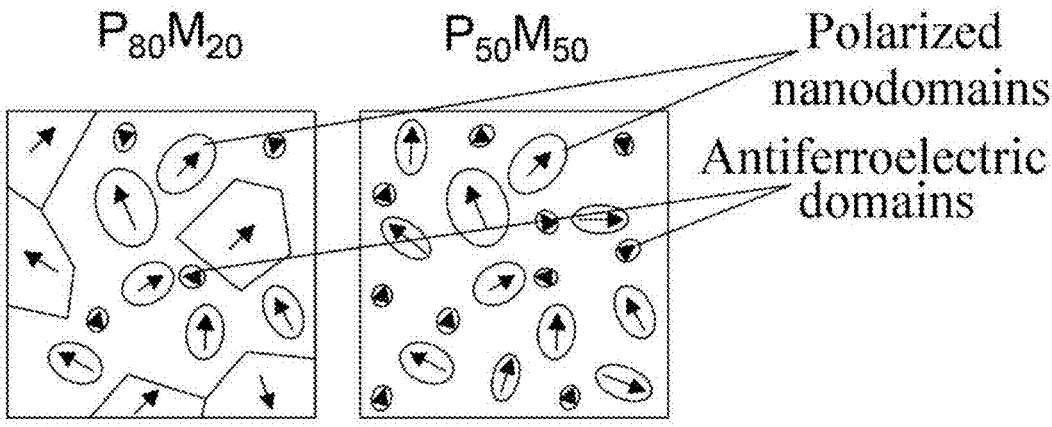
FIG. 2E shows a schematic diagram of a ferroelectric domain structure of the film materials prepared in Example 1 and Example 2.
Figure 2F:
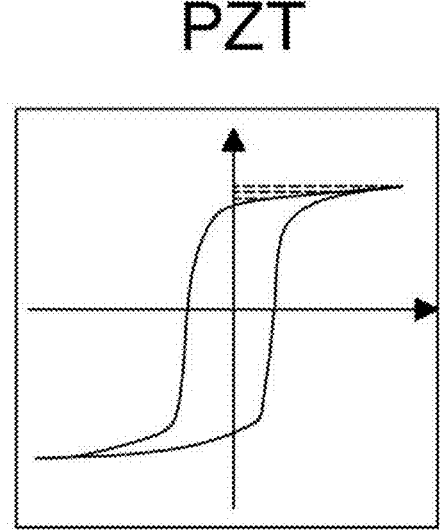
FIG. 2F shows a schematic diagram of a ferroelectric hysteresis loop of the film materials prepared in Comparative Example.
Figure 2G:
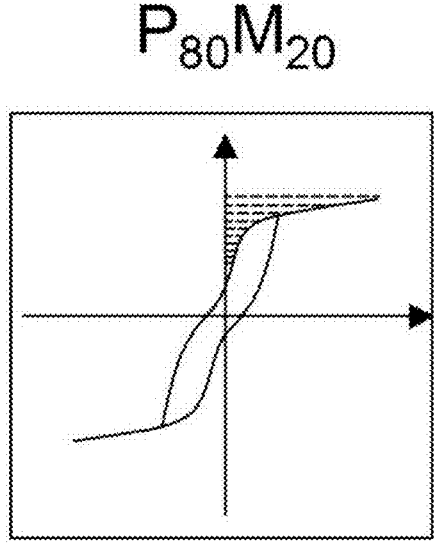
FIG. 2G shows a schematic diagram of a ferroelectric hysteresis loop of the film materials prepared in Example 1.
Figure 2H:
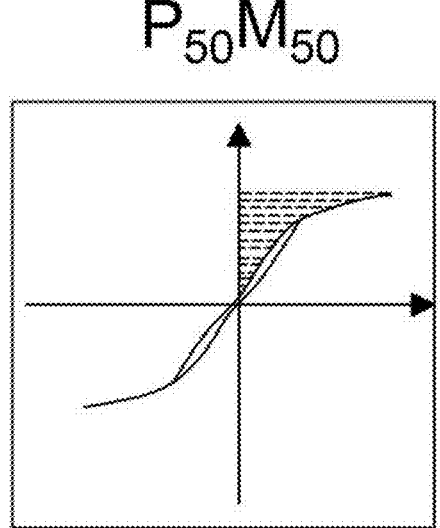
FIG. 2H shows a schematic diagram of a ferroelectric hysteresis loop of the film materials prepared in Example 2.

The film materials prepared in each example and comparative example were tested as follows: crystalline properties of the film materials were studied through XRD using Cu K$_\alpha$ radiation (λ=1.5406 Å) on a high-resolution X-ray diffractometer (Panalytical Empyrean); a ferroelectric hysteresis loop was determined using a Precision Premier II ferroelectric test platform of Radiant Technology (USA), and an energy storage density and an energy storage efficiency were calculated from the hysteresis loop; dielectric measurement was conducted with an impedance analyzer (EA990A) produced by Agilent Corporation (USA); before measuring the ferroelectric and dielectric properties, a circular platinum electrode with an area of $1.96\times10^{-5}$ cm$^2$ was sputtered on a surface of the film materials using magnetron sputtering. The test results are as follows:

As shown in FIG. 2A to FIG. 2C, a layer of SRO bottom electrode layer is grown on the STO (001) substrate through the pulsed laser deposition, and then the pure PZT and film capacitors with a vertical self-assembly structure of $P_{80}M_{20}$ and $P_{50}M_{50}$ with two-phase separation are grown. FIG. 2D to FIG. 2H show a schematic diagram of a principle achieving high energy storage density and high energy storage efficiency by adjusting the ratio of PZT phase and MgO phase: the pure PZT is a ferroelectric material with a tetragonal perovskite structure at ambient temperature, has macroscopic ferroelectric domains (FIG. 2D and FIG. 2E), and exhibits a typical square hysteresis loop under an electric field (FIG. 2F to FIG. 2H). The pure PZT shows lower energy storage density, energy storage efficiency, and breakdown strength. MgO is a linear dielectric with ultra-high breakdown field resistance, but exhibits a highly low dielectric constant, resulting in a small energy storage density. During construction into a nanocomposite film material by vertical self-assembly of the PZT and the MgO, with the decrease of the ratio of the PZT to MgO, the macroscopic ferroelectric domains of the PZT are gradually broken to form polarized nanodomains, and a small amount of anti-ferroelectric domains are introduced, making the composite film material with a ratio of $P_{50}M_{50}$ completely evolved into a relaxor antiferroelectric. The $P_{50}M_{50}$ relaxor antiferroelectric composite film material has an extremely high breakdown field resistance, and its polarization intensity-electric field intensity curve is significantly thinner (FIG. 2F to FIG. 2H), allowing the $P_{50}M_{50}$ relaxor antiferroelectric composite film material has a high energy storage density and energy storage efficiency.

Figure 3:
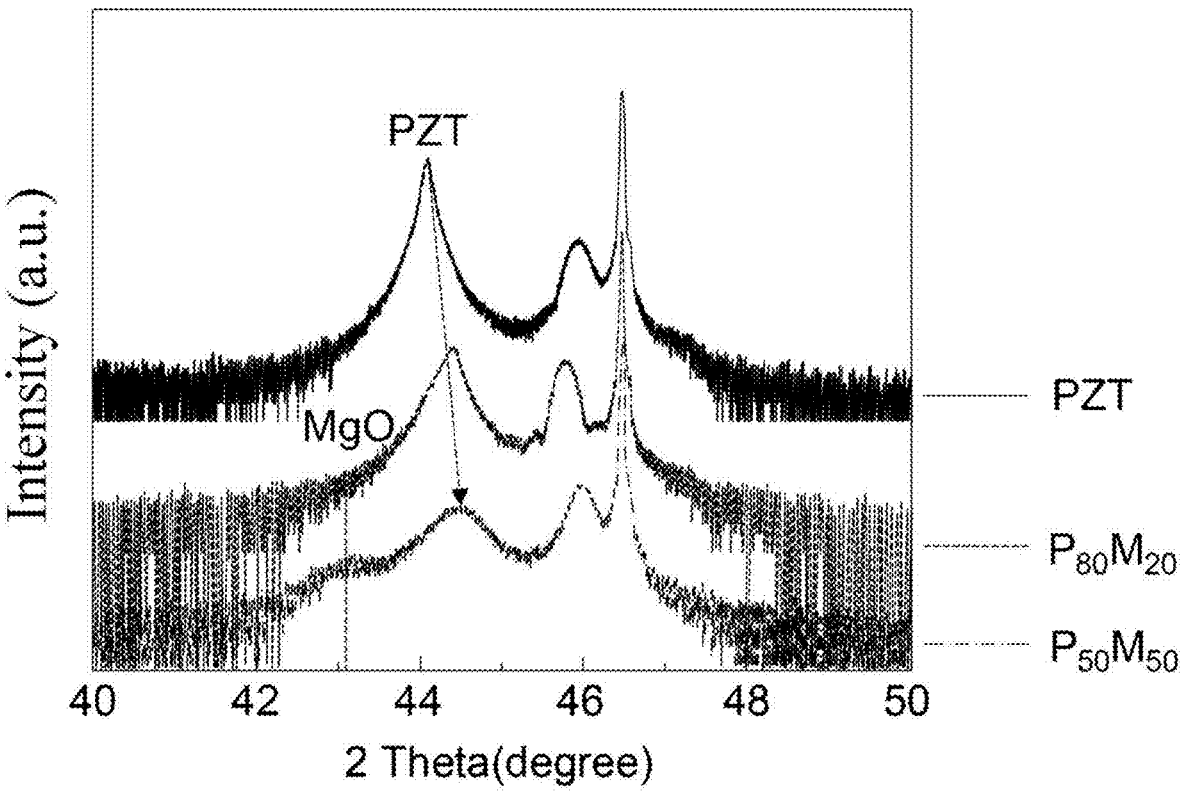
FIG. 3 shows an X-ray diffraction (XRD) pattern of the film materials prepared in Comparative Example, Example 1, and Example 2.

The film materials prepared in Comparative Example, Example 1, and Example 2 are subjected to XRD testing, and the results are shown in FIG. 3. As shown in FIG. 3, the pure PZT film material, the $P_{80}M_{20}$ composite film material, and the $P_{50}M_{50}$ composite film material are all in single-phase epitaxial growth without any other mixed phases. Meanwhile, the PZT phase of the composite film material is obviously shifted to a higher angle than that of the pure PZT film, that is, an out-of-plane lattice constant c decreases. Moreover, by testing an X-ray reciprocal space diagram of an in-plane (103) plane, it can be found that the lattice constant a of the pure PZT film material, the $P_{80}M_{20}$ composite film material, and the $P_{50}M_{50}$ composite film material is almost unchanged. In summary, with the increase of the MgO phase content, the out-of-plane lattice constant c of the PZT phase in the composite film materials decreases, and c/a of the unit cell decreases, resulting in a pseudocubic structure. This is one of the reasons that the PM composite films shows relaxation behavior.

Figure 4:
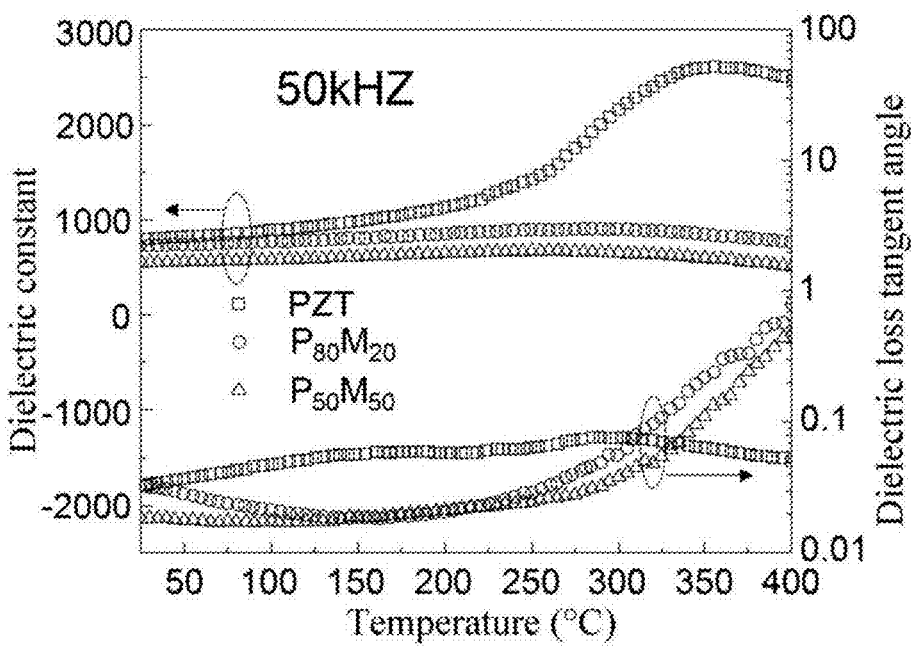
FIG. 4 shows a dielectric constant and a dielectric loss tangent angle-frequency spectrum and the dielectric constant and a dielectric loss tangent angle-temperature spectrum of the film materials prepared in Comparative Example, Example 1, and Example 2 at ambient temperature.

The dielectric constants and dielectric loss tangent angle-temperature spectra of the film materials prepared in Comparative Example, Example 1, and Example 2 are tested, and the results are shown in FIG. 4. As shown in FIG. 4, with the increase of the MgO content, a temperature ($T_m$) corresponding to the maximum dielectric constant gradually decreases, and the dielectric temperature curve becomes increasingly diffuse. The $T_m$ of the pure PZT film material, the $P_{80}M_{20}$ composite film material, and the $P_{50}M_{50}$ composite film material are 355° C., 290° C., and 250° C., respectively, proving that the composite film materials obtained by vertical self-assembly of PZT and MgO exhibit the characteristics of relaxor ferroelectric, making the composite film materials have a higher thermal stability. In addition, at ambient temperature, relative to the dielectric constant of the pure PZT film material, with the increase of the MgO content, the dielectric constant of the composite film materials gradually decreases. At ambient temperature, the dielectric constants of the pure PZT film material, the $P_{80}M_{20}$ composite film material, and the $P_{50}M_{50}$ composite film material are 803, 739, and 552, respectively. In addition, the dielectric loss of the composite film materials is also gradually decreasing. The dielectric losses of the pure PZT film material, the $P_{80}M_{20}$ composite film material, and the $P_{50}M_{50}$ composite film material are 0.03365, 0.03218, and 0.01826, respectively. This is due to the relaxor ferroelectric properties of the composite film materials, which promotes the reversal of nanopolarization domains and reduced energy loss.

Figure 5A:
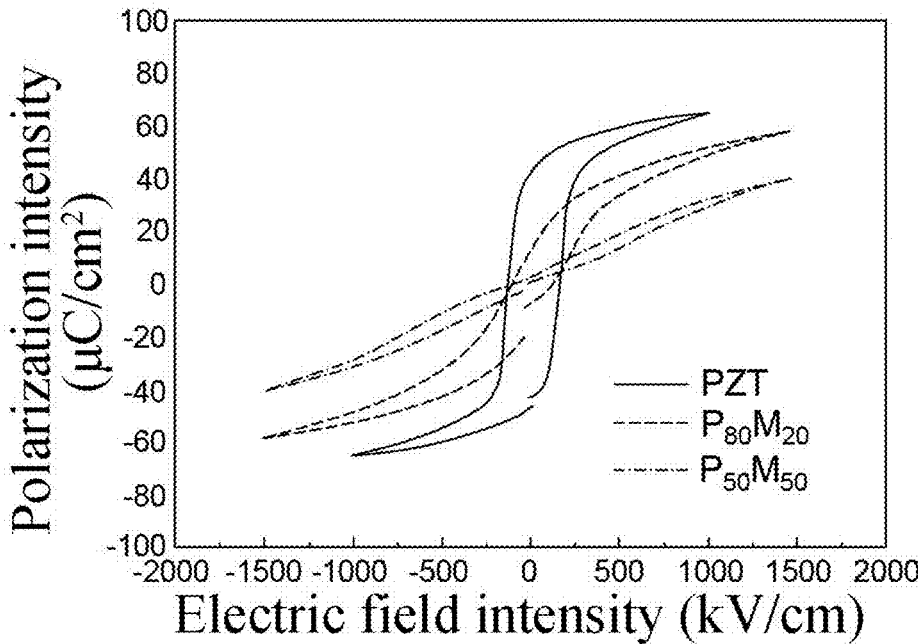
FIG. 5A shows an ferroelectric hysteresis loop under a low electric field of the film materials prepared in Comparative Example, Example 1, and Example 2.

As shown in FIG. 5A, the ferroelectric hysteresis loops of the pure PZT film material (1,000 kV/cm), the $P_{80}M_{20}$ composite film material, and the $P_{50}M_{50}$ composite film material (1,500 kV/cm) are tested under a low electric field intensity at a test frequency of 10 kHz, to characterize their dielectric polarization and energy storage performances. From the test results, it can be found that pure PZT film material exhibits a typical ferroelectric square hysteresis loop, and with the increase of the MgO content, the hysteresis loop becomes thinner and the polarization intensity becomes increasingly lower. At the same time, the $P_{50}M_{50}$ composite film material exhibits an electric hysteresis loop unique of relaxor ferroelectrics, and a waist shrinkage phenomenon appeared near 0 electric field, showing antiferroelectric properties. A saturation polarization intensity decreases from 65.2 $\mu C/cm^2$ of the pure PZT film material to 39.9 $\mu C/cm^2$ of the $P_{50}M_{50}$ composite film material, and a residual polarization intensity decreases from 43.2 $\mu C/cm^2$ of the pure PZT film material to 3.6 $\mu C/cm^2$ of the $P_{50}M_{50}$ composite film material. Calculated from the ferroelectric hysteresis loop: the energy storage density increases from 6.9 $J/cm^3$ of the pure PZT film material to 21.7 $J/cm^3$ of the $P_{50}M_{50}$ composite film material, and the energy storage efficiency increases from 34.1% of the pure PZT film material to 81% of the $P_{50}M_{50}$ composite film material. This is due to the relaxor antiferroelectric properties of the $P_{50}M_{50}$ composite film material.

Figure 5B:
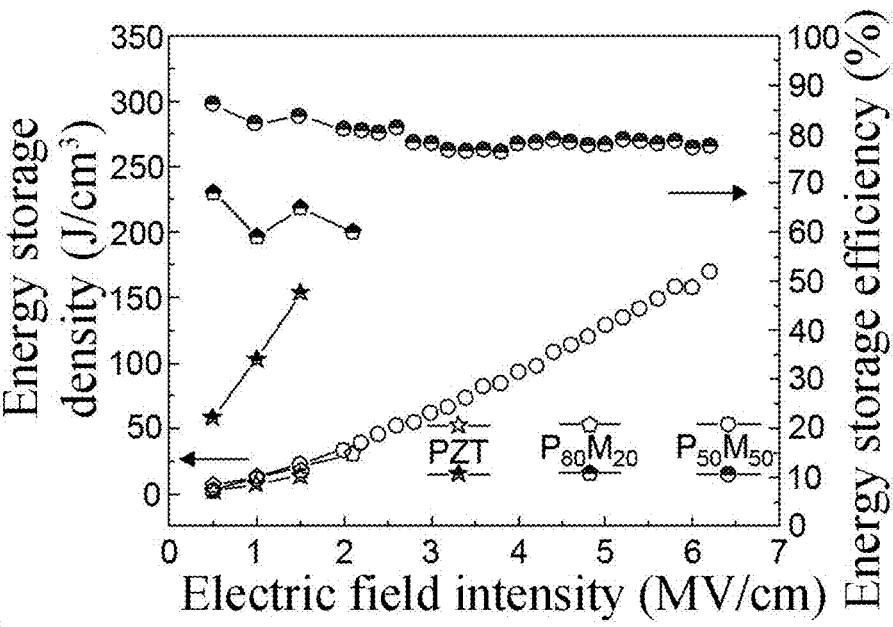
FIG. 5B shows an energy storage density and an energy storage efficiency under a breakdown field strength of the film materials prepared in Comparative Example, Example 1, and Example 2.
Figure 6A:
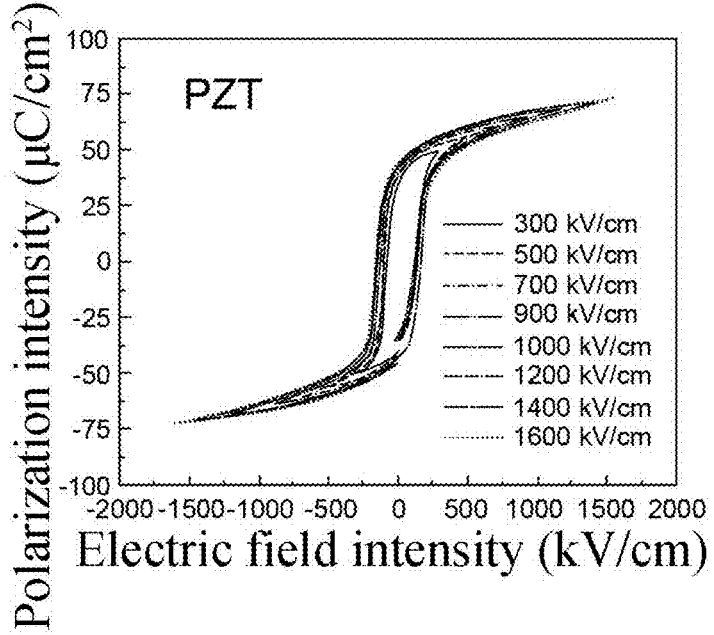
FIG. 6A shows a ferroelectric hysteresis loop of the film materials prepared in Comparative Example under different electric field strengths (at a test frequency of 10 kHZ)
Figure 6B:
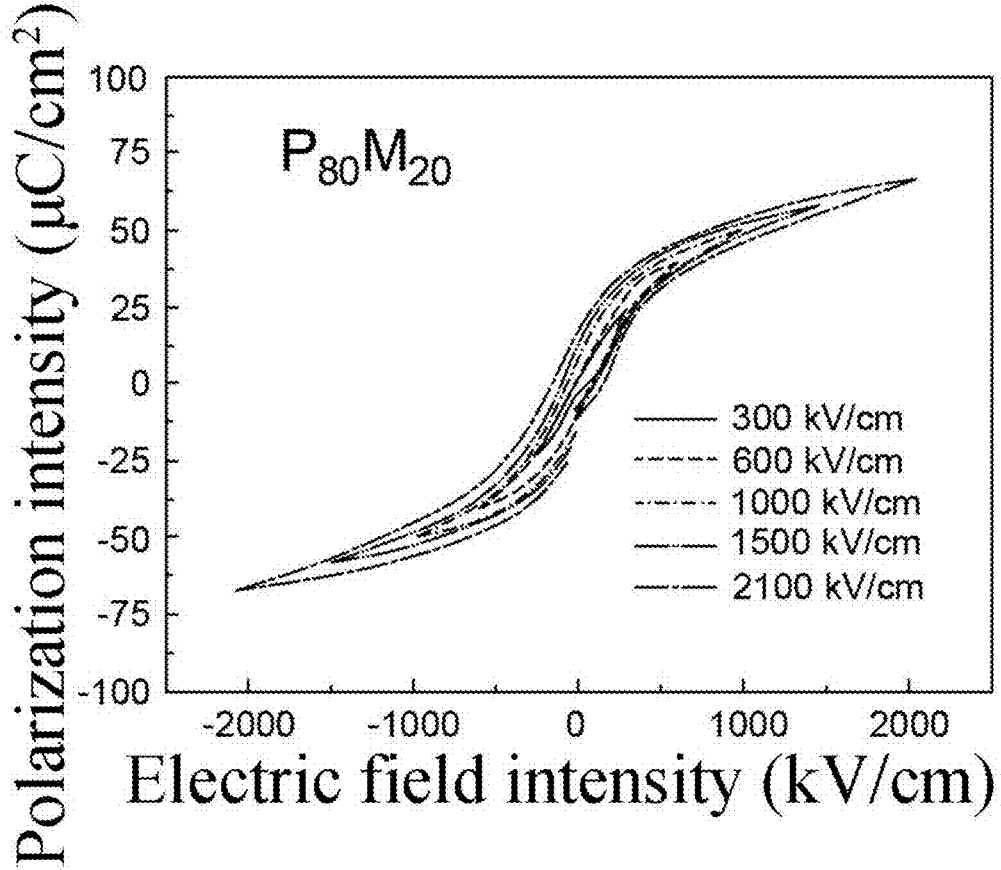
FIG. 6B shows a ferroelectric hysteresis loop of the film materials prepared in Example 1 under different electric field strengths (at a test frequency of 10 kHZ)
Figure 6C:
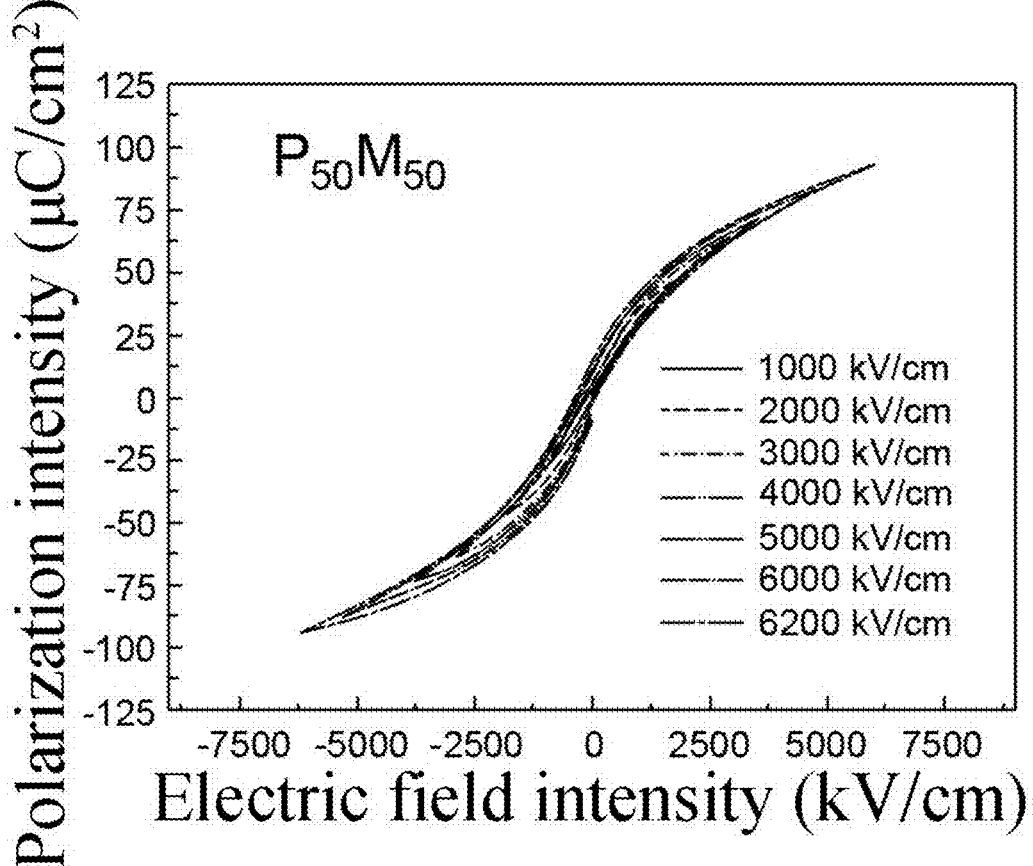
FIG. 6C shows a ferroelectric hysteresis loop of the film materials prepared in Example 2 under different electric field strengths (at a test frequency of 10 kHZ).

In order to study an energy storage potential of the composite film materials, the breakdown strengths of the pure PZT film material, the $P_{80}M_{20}$ composite film material, and the $P_{50}M_{50}$ composite film material are tested. From the results, it can be found that the breakdown strength of the pure PZT film material is 1.5 MV/cm, the breakdown strength of the $P_{80}M_{20}$ composite film material is 2.1 MV/cm, and the breakdown strength of the $P_{50}M_{50}$ composite film material is 6.2 MV/cm. From the test results, it can be found that compared with the pure PZT film material, the breakdown strengths of the composite film materials have been significantly improved, especially the high breakdown strength of 6.2 MV/cm of the $P_{50}M_{50}$ composite film material, which is the highest breakdown strength that could be achieved by lead-based dielectrics at present. As shown in FIG. 6A to FIG. 6C, the ferroelectric hysteresis loops of the pure PZT film material, the $P_{80}M_{20}$ composite film material, and the $P_{50}M_{50}$ composite film material are tested at their respective breakdown strengths. The energy storage efficiency and energy storage density of the pure PZT film material, the $P_{80}M_{20}$ composite film material, and the $P_{50}M_{50}$ composite film material under the highest breakdown field are calculated based on the electric hysteresis loop, as shown in FIG. 5B. From the test results, it can be found that the energy storage densities of the pure PZT film material, the $P_{80}M_{20}$ composite film material, and the $P_{50}M_{50}$ composite film material are: 13.7 $J/cm^3$, 30.9 $J/cm^3$, and 169.4 $J/cm^3$, respectively, and the energy storage efficiencies of the pure PZT film material, the $P_{80}M_{20}$ composite film material, and the $P_{50}M_{50}$ composite film material are: 47.5%, 60%, and 78%, respectively. The $P_{50}M_{50}$ composite film material has an energy storage density as high as 169.4 $J/cm^3$ while maintaining a high energy storage efficiency of 78%. It is worth mentioning that the energy storage capacity of the $P_{50}M_{50}$ nanocomposite dielectric film material for energy storage prepared by vertical self-assembly in the present disclosure exceeds that of current lead-based dielectric energy storage materials.

Figure 5C:
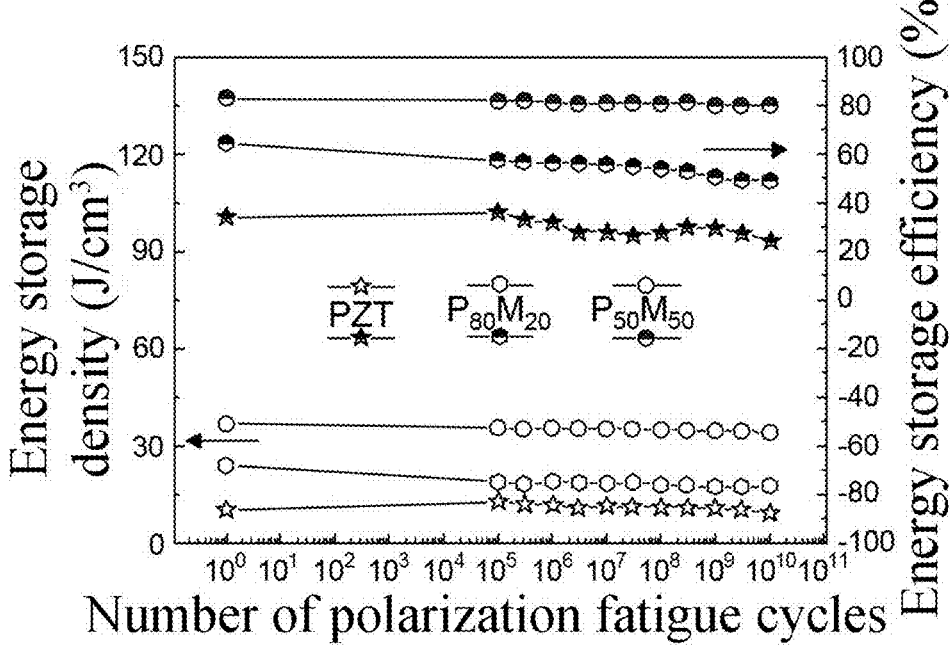
FIG. 5C shows an energy storage density and an energy storage efficiency performance after polarization fatigue of the film materials prepared in Comparative Example, Example 1, and Example 2.
Figure 5D:
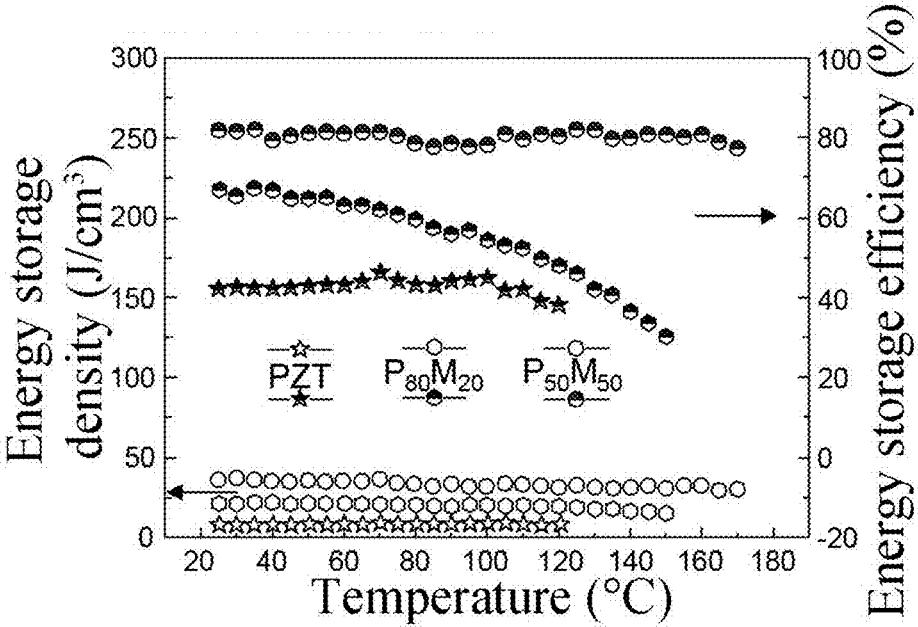
FIG. 5D shows an energy storage density and an energy storage efficiency performance at high temperatures of the film materials prepared in Comparative Example, Example 1, and Example 2.

In practical applications, performance reliability and temperature stability are also crucial for dielectric capacitors. As shown in FIG. 5C, a 20 kHz triangular wave is applied to the pure PZT film material, the $P_{80}M_{20}$ composite film material, and the $P_{50}M_{50}$ composite film material, such that the polarization fatigue endurances of the pure PZT film material at 1.0 MV/cm, the $P_{80}M_{20}$ composite film material at 1.5 MV/cm, and the $P_{50}M_{50}$ composite film material at 2.0 MV/cm are tested, respectively. From the test results, it can be found that the energy storage efficiency is decreased by 29.3% and the energy storage density is decreased by 10.6% of the pure PZT film material after $10^{10}$ times of polarization fatigue; the energy storage efficiency is decreased by 23.8% and the energy storage density is decreased by 27.4% of the $P_{80}M_{20}$ composite film material after $10^{10}$ times of polarization fatigue; the energy storage efficiency is only decreased by 3.4%, and the energy storage density is only decreased by 6.8% of the $P_{50}M_{50}$ composite film material after $10^{10}$ times of polarization fatigue. The results show that the $P_{50}M_{50}$ composite film material has a high reliability, which could be attributed to the fatigue suppression of domain wall pinning, benefiting from the presence of highly-dynamic polar nanodomain structures in the $P_{50}M_{50}$ composite film material. In addition, as shown in FIG. 5D, the $P_{50}M_{50}$ composite film material exhibits desirable polarization stability from ambient temperature to up to 170° C. (with an energy storage density change <16.4% and an energy storage efficiency change <5.2%), which is related to the temperature relaxation characteristics of the $P_{50}M_{50}$ composite film material, resulting in its dielectric properties being insensitive to temperature.

In the present disclosure, unless otherwise specified, the scientific and technical terms used herein have the meanings commonly understood by those skilled in the art. Meanwhile, agents, materials and steps used herein are those widely used in the corresponding field.

Finally, it should be noted that the above embodiments are only preferred embodiments of the present disclosure, and are not intended to limit the present disclosure. Although the present disclosure has been described in detail with reference to the foregoing embodiments, those skilled in the art may still modify the technical solutions described in the foregoing embodiments, or equivalently substitute some technical features thereof. Any modification, equivalent substitution, improvement, etc. within the spirit and principles of the present disclosure shall fall within the scope of the present disclosure.

What is claimed is:

1. A method for preparing a nanocomposite dielectric film material for energy storage prepared by vertical self-assembly of lead zirconate titanate (PZT) and magnesium oxide (MgO), comprising:

step 1, preparing a PZT powder;

step 2, mixing the PZT powder obtained in step 1 with an MgO powder to obtain a mixed PM composite powder; and mixing the PM composite powder with a binder to obtain a mixture; and subjecting the mixture to tableting and cold isostatic pressing to obtain a PM composite target blank;

step 3, sintering the PM composite target blank obtained in step 2 at a temperature of not higher than 900° C. to obtain a PM composite target; and step 4, subjecting the PM composite target obtained in step 3 to pulsed laser deposition to form an epitaxial vertical self-assembly composite dielectric film; and subjecting the epitaxial vertical self-assembly composite dielectric film to annealing to obtain the nanocomposite dielectric film material for energy storage, wherein during the pulsed laser deposition, an ordered structure is spontaneously formed by a PZT phase and an MgO phase, and the ordered structure is then deposited to form the epitaxial vertical self-assembly composite dielectric film.

2. The method of claim 1, wherein in step 1, the PZT powder is prepared from PbO, $ZrO_2$, and $TiO_2$; and a mass ratio of the PbO, the $ZrO_2$, and the $TiO_2$ is in a range of (6.66-6.88):(1.77-1.83):(1.02-1.05).

3. The method of claim 1, wherein a mass ratio of the MgO powder to the PZT powder is in a range of (0.28-0.59):(9.41-9.72).

4. The method of claim 1, wherein in step 1, preparing the PZT powder is performed by:

mixing raw material powders of PbO, $ZrO_2$, and $TiO_2$ to obtain a mixed powder;

mixing the mixed powder with absolute ethanol to obtain a mixed material;

subjecting the mixed material to ball milling for 12 h to obtain a ball milled material;

subjecting the ball milled material to drying and sieving sequentially to obtain a mixed raw material powder; and presintering the mixed raw material powder by heating the mixed raw material powder from room temperature to a temperature of 950° C. to 1,000° C. at a heating rate of 5° C./min, maintaining at the temperature for 6 h, and then cooling to room temperature at a cooling rate of 5° C./min to obtain the PZT powder.

5. The method of claim 1, wherein the method further comprises in step 2, after mixing the PZT powder with the MgO powder, subjecting an obtained powder mixture to ball milling, drying, and sieving in sequence to obtain the mixed PM composite powder;

the binder is polyvinyl alcohol (PVA) with a mass fraction of 5%;

the tableting is conducted at a pressure of 9 MPa to 11 MPa; and the cold isostatic pressing is conducted for 30 min.

6. The method of claim 1, wherein in step 3, the sintering is performed by:

heating the PM composite target blank from room temperature to 500° C. at a heating rate of 5° C./min, and maintaining at 500° C. for 1 h to remove the binder to obtain a binder-removed material;

heating the binder-removed material to a temperature of 800° C. to 850° C. at a heating rate of 5° C./min, and maintaining at the temperature for 2 h to perform sintering to obtain a sintered material; and cooling the sintered material to room temperature at a cooling rate of 5° C./min to obtain the PM composite target.

7. The method of claim 1, wherein in step 4, the pulsed laser deposition is performed by:

bombarding the PM composite target with a KrF laser, such that components in the PM composite target are ablated and vaporized in a stoichiometric ratio to form a high-temperature and high-pressure plasma plume in a vacuum chamber, and the high-temperature and high-pressure plasma plume is diffused to a (001) strontium titanate ($SrTiO_3$) (STO) substrate with a strontium ruthenate ($SrRuO_3$) (SRO) bottom electrode layer and deposited and grown into the epitaxial vertical self-assembly composite dielectric film;

wherein bombarding the PM composite target with the KrF laser is performed at an energy density of the KrF laser of 1.2 $J \cdot cm^{-2}$ to 1.8 $J \cdot cm^{-2}$, a repetition frequency of the KrF laser of 4 Hz, a temperature of the substrate of 495° C. to 510° C., and an oxygen partial pressure of 0.15 mbar; and in the STO substrate with an SRO bottom electrode layer, the SRO bottom electrode layer is obtained by depositing SRO at a temperature of 630° C. and an oxygen partial pressure of 0.15 mbar; and the SRO bottom electrode layer has a thickness of 30 nm.

8. The method of claim 1, wherein in step 4, the annealing is performed by subjecting the epitaxial vertical self-assembly composite dielectric film to in-situ annealing at an oxygen partial pressure of 5 mbar and a temperature of 510° C. for 20 min, and then naturally cooling to room temperature.

9. The method of claim 1, wherein the nanocomposite dielectric film material for energy storage has a thickness of 100 nm.

* * * * *